United States Patent [19]

Kleinberg

[11] Patent Number: 4,660,000
[45] Date of Patent: Apr. 21, 1987

[54] LOW PHASE NOISE OSCILLATOR USING TWO PARALLEL CONNECTED AMPLIFIERS

[75] Inventor: Leonard L. Kleinberg, Annapolis, Md.

[73] Assignee: The United States of America as represented by the Administrator of the National Aeronautics and Space Administration, Washington, D.C.

[21] Appl. No.: 862,959

[22] Filed: May 14, 1986

[51] Int. Cl.⁴ ............................ H03B 5/12; H03B 5/36
[52] U.S. Cl. ................................. 331/56; 331/116 R; 331/117 R
[58] Field of Search ............... 331/56, 116 R, 116 FE, 331/117 R, 117 FE, 159, 168

[56] References Cited

U.S. PATENT DOCUMENTS 2,871,354 1/1959 Perlman ........................... 331/117 R
3,806,831 4/1974 Kleinberg ........................ 331/116 R Primary Examiner—Siegfried H. Grimm
Attorney, Agent, or Firm—John O. Tresansky; John R. Manning; Harry Lupuloff

[57] ABSTRACT

A high frequency oscillator is provided by connecting two amplifier circuits in parallel where each amplifier circuit provides the other amplifier circuit with the conditions necessary for oscillation. The inherent noise present in both amplifier circuits causes the quiescent current, and in turn, the generated frequency, to change. The changes in quiescent current cause the transconductance and the load impedance of each amplifier circuit to vary, and this in turn results in opposing changes in the input susceptance of each amplifier circuit. Because the changes in input susceptance oppose each other, the changes in quiescent current also oppose each other. The net result is that frequency stability is enhanced.

17 Claims, 5 Drawing Figures

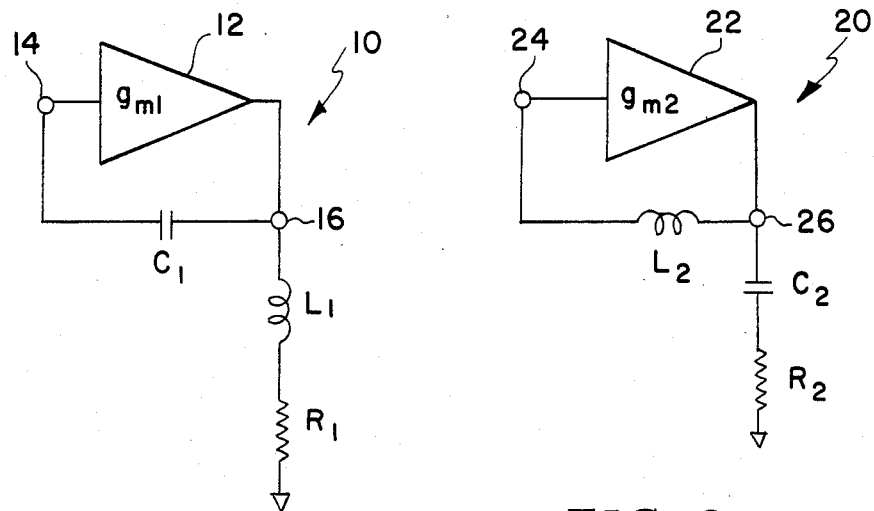
FIG. 1
FIG. 2
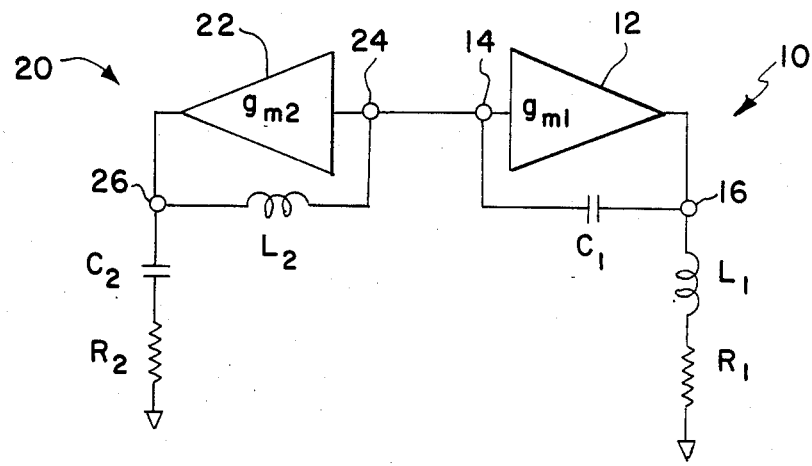
FIG. 3

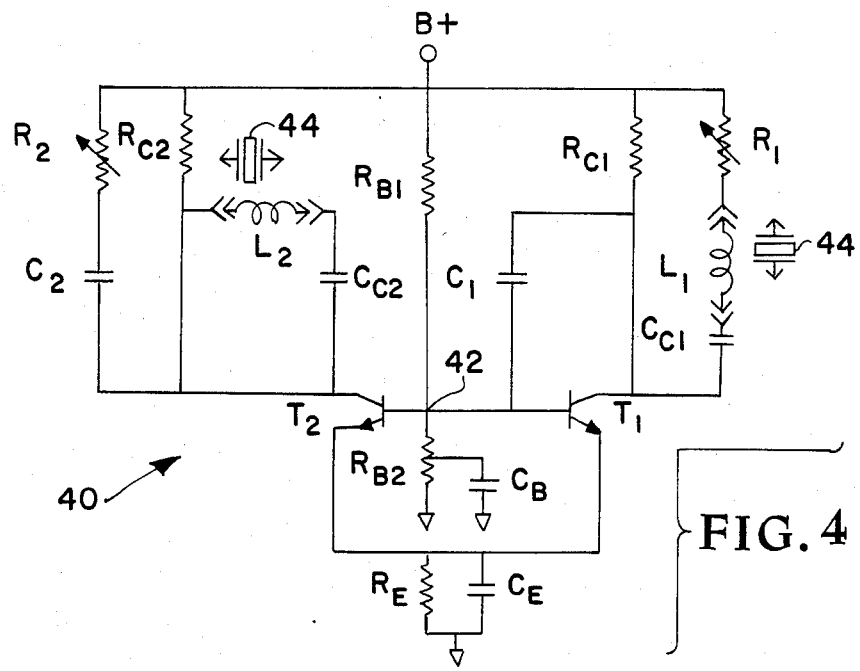
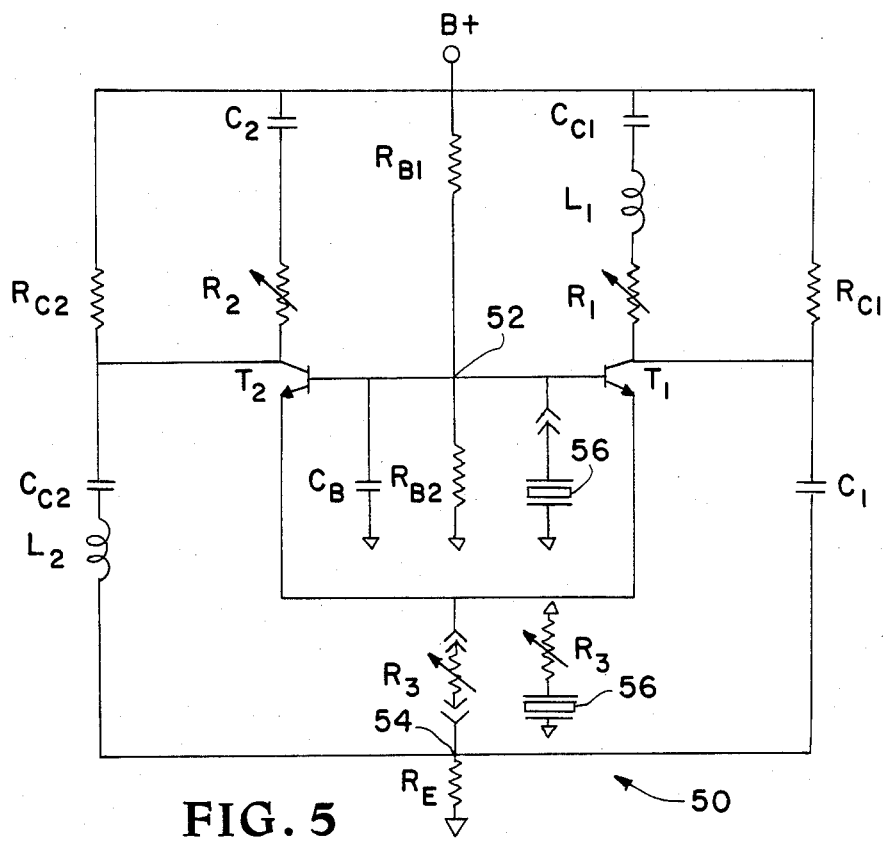
FIG. 4
FIG. 5

LOW PHASE NOISE OSCILLATOR USING TWO PARALLEL CONNECTED AMPLIFIERS

ORIGIN OF INVENTION

The invention described herein was made by an employee of the U.S. Government and may be manufactured and used by or for the government of the United States of America for Governmental purposes without the payment of any royalties thereon or therefor.

TECHNICAL FIELD

This invention relates generally to oscillators, and more particularly to a frequency stable, low phase noise sinusoidal oscillator.

BACKGROUND ART

Conventional oscillator circuit configurations consist essentially of Colpitts, Hartley, Pierce, and Miller type configurations, or variations thereof. These configurations are generally unstable due to their inherent noise. The inherent noise, which is comprised of $1/f$, shot, and thermal noise, causes random instantaneous changes in the quiescent current level of the oscillator. The random, instantaneous changes in quiescent current, in turn, produce instantaneous changes in the frequency generated. This effect is called phase noise, and it is generally defined as narrow band phase modulation by noise.

The usual approach to achieving oscillator stability is to utilize high-Q crystals in conjunction with active elements selected for their low noise characteristics. This approach, however, does nothing to reduce oscillator instability caused by inherent noise.

SUMMARY OF THE INVENTION

Accordingly, it is an object of this invention to provide a high frequency sinusoidal oscillator.

Another object of the invention is to provide a frequency stable oscillator.

According to the present invention, the foregoing and other objects are attained by providing a pair of amplifier circuits. The first amplifier circuit has an inductive load impedance and a capacitive input susceptance. The second amplifier circuit has a capacitive load impedance and an inductive input susceptance. The two amplifier circuits can be made to oscillate by making the total closed loop conductance negative and the total closed loop susceptance zero. These conditions are met by connecting the two amplifier circuits in parallel. When this is done, the inductive input susceptance of the second amplifier circuit provides the first amplifier circuit with negative conductance which renders the first amplifier circuit operational as a Hartley oscillator, and the capacitive input susceptance of the first amplifier circuit provides the second amplifier circuit with negative conductance which renders the second amplifier circuit operational as a Colpitts oscillator. The frequency generated by each of the oscillators is identical.

The inherent noise present in both amplifier circuits causes the quiescent current of, and in turn, the frequency generated by, each amplifier circuit to change. The changes in quiescent current cause direct changes in the transconductance and the load impedance of each amplifier circuit. This in turn causes direct changes in the capacitive input susceptance of the first amplifier circuit and the inductance input susceptance of the second amplifier circuit. However, the changes in input susceptance oppose each other in the parallel connected amplifier circuits because the total susceptance is zero. Accordingly, an increase in the quiescent current in one-half of the circuit with an accompanying change in the frequency generated is opposed by a decrease in the quiescent current in the other half of the circuit and an accompanying opposite change in the frequency generated. The changes in frequency cancel, and the net result is a reduction in frequency instability due to inherent noise.

BRIEF DESCRIPTION OF THE DRAWINGS

The invention will be better understood from the following description which makes reference to the appended drawings wherein:

FIG. 1 is a schematic representation of one amplifier circuit used in this invention.

FIG. 2 is a schematic representation of another amplifier circuit used in this invention.

FIG. 3 is a schematic representation of the amplifier circuits of FIGS. 1 and 2 connected in parallel.

FIG. 4 is a schematic representation of one embodiment of this invention.

FIG. 5 is a schematic representation of another embodiment of this invention.

DETAILED DESCRIPTION

Referring now to the drawings wherein like reference numerals and characters designate identical or corresponding parts throughout the several views, and more particularly to FIG. 1 wherein an amplifier circuit 10 is illustrated. The amplifier circuit 10 includes an amplifier 12 having an input terminal 14, an output terminal 16, and a transconductance $g_{m1}$. A capacitor $C_1$, which provides the amplifier circuit 10 with capacitive input susceptance, shunts the terminals 14 and 16. An inductance $L_1$ and a resistor $R_1$ are serially connected between the output terminal 16 and ground. The inductor $L_1$ provides the amplifier circuit 10 with inductive load impedance.

FIG. 2 illustrates another amplifier circuit 20 having an amplifier 22 with a transductance $g_{m2}$, an input terminal 24, and an output terminal 26. The input and output terminals are shunted by an inductor $L_2$, which provides this amplifier circuit with inductive input susceptance. A capacitor $C_2$ and a resistor $R_2$ are connected in series between the output terminal 26 and ground. The capacitor $C_2$ provides the amplifier circuit 20 with capacitive load impedance.

The two amplifier circuits can be used to model grounded emitter transistor amplifiers. When this is done, the input impedance $Y_1$ of the amplifier circuit 10, which is a function of angular frequency w, may be expressed as:

$$Y_1 = \frac{1 + g_{m1}(jwL_1 + R_1)}{jwL_1 + \frac{1}{jwC_1} + R_1}, \quad (1)$$

and the input impedance $Y_2$ of the amplifier circuit 20, which is also a function of angular frequency w, may be expressed as:

$$Y_2 = \frac{1 + g_{m2}\left(\frac{1}{j\omega C_2} + R_2\right)}{j\omega L_2 + \frac{1}{j\omega C_2} + R_2}. \quad (2)$$

The values of $R_1$ and $R_2$, when compared to the values of the terms $jwL_1 + 1/jwC_1$ and $jwL_2 1/jwC_2$ from the denominators of equations (1) and (2), are generally very small in practical transistor circuits. Accordingly, equations (1) and (2) may be expressed as truncated binomial expansions:

$$Y_1 = \frac{1 + g_{m1}(j\omega L_1 + R_1)}{\left[j\omega L_1 + \frac{1}{j\omega C_1}\right]\left[1 + \frac{R_1}{j\omega L_1 + \frac{1}{j\omega C_1}}\right]} \quad (3)$$

and $$Y_2 = \frac{1 + g_{m2}\left(\frac{1}{j\omega C_2} + R_2\right)}{\left[j\omega L_2 + \frac{1}{j\omega C_2}\right]\left[1 + \frac{R_2}{j\omega L_2 + \frac{1}{j\omega C_2}}\right]}. \quad (4)$$

When the real and reactive terms are grouped together, equations (3) and (4) reduce to:

$$Y_1 = \left[\frac{1 + g_{m1}R_1}{j\omega L_1 + \frac{1}{j\omega C_1}} + \frac{g_{m1}j\omega L_1 R_1}{\left(\omega L_1 - \frac{1}{\omega C_1}\right)^2}\right] + \left[\frac{g_{m1}}{1 - \frac{1}{\omega^2 L_1 C_1}} + \frac{R_1(1 + g_{m1}R_1)}{\left(\omega L_1 - \frac{1}{\omega C_1}\right)^2}\right] \quad (5)$$

and $$Y_2 = \left[\frac{1 + g_{m2}R_2}{j\omega L_2 + \frac{1}{j\omega C_2}} + \frac{g_{m2}R_2\left(\frac{1}{j\omega C_2}\right)}{\left(\omega L_2 - \frac{1}{\omega C_2}\right)^2}\right] + \left[\frac{g_{m2}}{1 - \omega^2 L_2 C_2} + \frac{R_2(1 + g_{m2}R_2)}{\left(\omega L_2 - \frac{1}{\omega C_2}\right)^2}\right]. \quad (6)$$

The first term of equation (5) represents the capacitive input susceptance of amplifier circuit 10, while the third term represents the positive feedback, or equivalently, the negative conductance. Correspondingly, the first term of equation (6) represents the inductive input susceptance of amplifier circuit 20, while its third term represents the negative conductance. For the third term of equation (5) to be negative, $w^2$ must be less than $1/L_1 C_1$, and for the third term of equation (6) to be negative, $w^2$ must be greater than $1/L_2 C_2$. These conditions imply that an inductance placed across the input terminal 14 of amplifier circuit 10 will guarantee that its closed loop conductance is negative, and that the closed loop conductance of amplifier circuit 20 will be guaranteed to be negative if a capacitance is placed across its input terminal 24.

If the two amplifier circuits are connected in parallel as illustrated in FIG. 3, by interconnecting their input terminals the capacitive input susceptance of the amplifier circuit 10 will provide the amplifier circuit 20 with negative conductance, the inductive input susceptance of the amplifier circuit 20 will provide the amplifier circuit 10 with negative conductance, and the total closed loop conductance will be negative. This circuit configuration effectively renders the amplifier circuit 10 operational as a Hartley-type oscillator and the amplifier circuit 20 operational as a Colpitts-type oscillator. The frequency generated by each of the oscillators in this circuit configuration will be identical because each amplifier circuit provides the other with the conditions necessary for oscillation. Oscillation will be sustained if the total closed loop susceptance is zero, which may be expressed as:

$$\frac{1 + g_{m1}R_1}{jwL_1 + \frac{1}{jwC_2}} + \frac{1 + g_{m2}R_2}{jwL_2 + \frac{1}{jwC_2}} = 0. \quad (7)$$

This expression may be simplified by insuring that $g_{m1}R_1 = g_{m2}R_2$, which yields:

$$\frac{1}{jwL_1 + \frac{1}{jwC_1}} + \frac{1}{jwL_2 + \frac{1}{jwC_2}} = 0. \quad (8)$$

Solving for w yields:

$$w^2 = \frac{C_1 + C_2}{(L_1 + L_2)(C_1 C_2)}. \quad (9)$$

FIG. 4 shows a preferred grounded emitter configuration 40 of the oscillator according to this invention. In this embodiment of the circuit includes two matched npn transistors $T_1$ and $T_2$ having commonly directly connected base and emitter electrodes. The quiescent operating point of the transistors is set by a voltage divider network connected between a source of B+ voltage and ground, a resistor $R_{c1}$ connected between the source of B+ voltage and the collector electrode of the transistor $T_1$, a resistor $R_{c2}$ connected between the source of B+ voltage and the collector electrode of the transistor $T_2$, and a resistor $R_E$ connected between the common emitter electrodes and ground. The voltage divider network has serially connected resistors $R_{B1}$ and $R_{B2}$ connected at their juncture 42 to the commonly joined base electrodes of the transistors thereby providing the bases with an intermediate voltage. A capacitor $C_B$ is connected between an adjustable tap on the resistor $R_{B2}$ and ground, and a capacitor $C_E$ is connected in parallel with resistor $R_E$. These capacitors are provided so that resistors $R_{B2}$ and $R_E$ only affect the direct current operation of the circuit. The resistor $R_{B2}$ is tapped to provide positive admittance across point 42 thereby reducing the excess gain present in the circuit 40, and to limit the severity of any clipping of the sinusoidal oscillations produced by the oscillator circuit 40.

A series network composed of a variable resistor $R_1$, an inductor $L_1$, and a capacitor $C_{c1}$ is connected between the source of B+ voltage and the collector electrode of the transistor $T_1$. A series network including a variable resistor $R_2$ and a capacitor $C_2$ is connected between the source of B+ voltage and the collector electrode of the transistor $T_2$. Resistors $R_1$ and $R_2$ are variable to allow the terms $g_{m1}R_2$ and $g_{m2}R_2$ from equations (5) and (6) to be varied so that the symmetry of the oscillator circuit 40 can be adjusted. The collector and base electrodes of the transistor $T_1$ are shunted by a capacitor $C_1$, and the collector and base electrodes of the transistor $T_2$ are shunted by the series combination of an inductor $L_2$ and a coupling capacitor $C_{c2}$.

An oscillator frequency of 10 MHz was obtained when the following exemplary components were used in oscillator circuit 40:

$T_1 = 2N2369$
$T_2 = 2N2369$
$R_{B1} = 100$ k$\Omega$
$R_{B2} = 33$ k$\Omega$
$R_{C1} = 5.1$ k$\Omega$
$R_{C2} = 5.1$ k$\Omega$
$R_E = 2$ k$\Omega$
$C_B = 6.1$ $\mu$f
$C_E = 0.1$ $\mu$f
$C_{c1} = 0.1$ $\mu$f
$C_{c2} = 0.1$ $\mu$f
$R_1 = 100\Omega$
$R_2 = 100\Omega$
$C_1 = 15.9$ pf
$C_2 = 212.0$ pf
$L_1 = 4.0$ $\mu$H
$L_2 = 4.8$ $\mu$H
B+ = 15 volts With the proper selection of component values, a stable oscillator can be achieved for any discrete frequency within the range of frequencies of 5 to 20 MHz.

The oscillator circuit 40 is extremely stable. This is in part due to the effect of the inherent noise present in the oscillator circuit 40 which causes the values of the capacitive and inductive input susceptances due to the capacitor $C_1$ and the inductor $L_2$ to vary. These variations cause the frequency generated in one half of the circuit to increase and the frequency generated in the other half of the circuit to decrease. The changes in generated frequency oppose each other due to the opposition to each other of changes in input susceptance thereby enhancing the frequency stability.

The oscillator circuit 40 also partially owes its stability to the way the circuit is biased. The resistors $R_{B1}$ and $R_{B2}$ are chosen so that the bias voltage at the commonly connected bases is equal to one half of the voltage of the source of B+ voltage thereby to assure symmetry of the oscillator signal. The biasing arrangement, along with the symmetrical configuration of the circuit and the tap on resistor $R_{B2}$, causes the gain of the circuit to be below the level at which hard limiting or clipping of the oscillator signal occurs. If hard limiting or clipping occurs, excessive noise is produced, which, in turn, produces frequency instability.

To improve the stability of the oscillator circuit 40, a crystal 44 may be inserted in the circuit to replace either of the inductors $L_1$ or $L_2$. If the inductor $L_2$ is replaced with the crystal 44, the oscillator circuit 40 becomes the equivalent of a compensated Pierce oscillator.

The preferred output point of the oscillator circuit 40 is the juncture 42. To take the output signal from this point ensures that the symmetry of the circuit will be maintained. This is because neither half of the circuit will be loaded more than the other half of the circuit.

The two amplifier circuits in FIGS. 1 and 2 may also be used to model grounded base transistor amplifiers. When this is done, the input impedance $Y_1$ of amplifier circuit 10, which is a function of angular frequency w, can be expressed as:

$$Y_1 = \frac{1 - g_{m1}(jwL_1 + R_1)}{jwL_1 + \frac{1}{jwC_1} + R_1}, \quad (10)$$

and the input impedance $Y_2$ of amplifier circuit 20, which is also a function of angular frequency w, can be expressed as:

$$Y_2 = \frac{1 - g_{m2}\left(\frac{1}{j\omega C_2} + R_2\right)}{j\omega L_2 + \frac{1}{j\omega C_2} + R_2}. \quad (11)$$

The values of $R_1$ and $R_2$, when compared to the values of the terms, $jwL_1 + 1/jwC_1$ and $jwL_2 + 1/jwC_2$ from the denominator of equations (10) and (11), are generally very small in practical transistor circuits. Accordingly, equations (10) and (11) may be expressed as truncated binomial expansions:

$$Y_1 = \frac{1 - g_{m1}(j\omega L_1 + R_1)}{\left[j\omega L_1 + \frac{1}{j\omega C_1}\right]\left[1 + \frac{R_1}{j\omega L_1 + \frac{1}{j\omega C_1}}\right]} \quad (12)$$

and $$Y_2 = \frac{1 - g_{m2}\left(\frac{1}{j\omega C_2} + R_2\right)}{\left[j\omega L_2 + \frac{1}{j\omega C_2}\right]\left[1 + \frac{R_2}{j\omega L_2 + \frac{1}{j\omega C_2}}\right]} \quad (13)$$

When the real and reactive terms are grouped together, equations (12) and (13) reduce to:

$$Y_1 = \left[\frac{1 - g_{m1}R_1}{j\omega L_1 + \frac{1}{j\omega C_1}} - \frac{(1 - g_{m1}R_1)R_1}{\left(j\omega L_1 + \frac{1}{j\omega C_1}\right)^2} - \frac{g_{m1}j\omega L_1}{j\omega L_1 + \frac{1}{j\omega C_1}} + \frac{g_{m1}j\omega L_1 R_1}{\left(j\omega L_2 + \frac{1}{j\omega C_2}\right)^2}\right], \quad (14)$$

and $$Y_2 = \frac{1 - g_{m2}R_2}{j\omega L_2 + \frac{1}{j\omega C_2}} - \frac{(1 - g_{m2})R_2}{\left(j\omega L_2 + \frac{1}{j\omega C_2}\right)^2} - \quad (15)$$

-continued $$\frac{g_{m2}\left(\frac{1}{j\omega C_2}\right)}{j\omega L_2 + \frac{1}{j\omega C_2}} + \frac{g_{m2}R_2\left(\frac{1}{j\omega C_2}\right)}{\left(j\omega L_2 + \frac{1}{j\omega C_2}\right)^2}\Bigg]$$

The first term of equation (14) represents the capacitive input susceptance of the amplifier circuit 10, and the third term represents the positive feedback, or equivalently, the negative conductance. Correspondingly, the first term of equation (15) represents the inductive input susceptance of the amplifier circuit 20, while its third term represents the negative conductance. When the two amplifier circuits are connected in parallel as illustrated in FIG. 3 by connecting their input terminals to each other, the capacitance input susceptance of amplifier circuit 10 will provide amplifier circuit 20 with negative conductance, the inductive input susceptance of amplifier circuit 20 will provide amplifier circuit 10 with negative conductance, and the total closed loop conductance will be negative. This circuit configuration effectively renders the amplifier circuit 10 operational as a Hartley-type oscillator and the amplifier circuit 20 operational as a Colpitts-type oscillator.

The frequency generated by each of the oscillators in the circuit of FIG. 3 will be identical. This is because each amplifier circuit provides the other amplifier circuit with the conditions necessary for oscillation. Oscillation will be sustained if the total closed loop susceptance is zero, which may be expressed as:

$$\frac{1 - g_{m1}R_1}{jwL_1 + \frac{1}{jwC_1}} + \frac{1 - g_{m2}R_2}{jwL_2 + \frac{1}{jwC_2}} = 0. \quad (17)$$

This expression can be simplified by setting $g_{m1}R_1$ equal to $g_{m1}R_2$, which yields:

$$\frac{1}{jwL_1 + \frac{1}{jwC_2}} + \frac{1}{jwL_2 + \frac{1}{jwC_2}} = 0. \quad (18)$$

Solving for w yields:

$$w^2 = \frac{C_1 + C_2}{(L_1 + L_2)(C_1 C_2)}. \quad (19)$$

Referring now to FIG. 5, a preferred grounded base configuration 50 of the oscillator according to this invention is illustrated. In this embodiment, the circuit includes two matched npn transistors $T_1$ and $T_2$ having commonly directly connected base and emitter electrodes. The quiescent operating point of the transistors is set by a voltage divider network connected between a source of B+ voltage and ground, a voltage divider network connected between the common emitter electrodes and ground, a resistor $R_{C1}$ connected between the source of B+ voltage and the collector electrode of the transistor $T_1$, and a resistor $R_{C2}$ connected between the source of B+ voltage and the collector electrode of the transistor $T_2$. The first voltage divider network includes serially connected resistors $R_{B1}$ and $R_{B2}$ connected at their juncture 52 to the common base electrodes, and the second voltage divider network includes a variable resistor $R_3$ and a resistor $R_E$ connected in series at point 54. The resistor $R_3$ is variable to add positive admittance to the juncture 54 to compensate for excess gain present in the circuit 50, and to limit the severity of any clipping of the sinusoidal oscillations produced by this circuit. A bypass capacitor $C_B$ is connected in parallel with the resistor $R_{B2}$ to ensure that the resistor $R_{B2}$ only affects the direct current operation of the circuit.

A series network composed of a variable resistor $R_1$, an inductor $L_1$, and a coupling capacitor $C_{C1}$, is connected in parallel with the resistor $R_{C1}$, and another series network having a variable resistor $R_2$ and a capacitor $C_2$ as connected in parallel with the resistor $R_{C2}$. A capacitor $C_1$ is connected between the collector electrode of the transistor $T_1$ and juncture 54. An inductor $L_2$ and a coupling capacitor $C_{C2}$ are connected in series between the collector electrode of the transistor $T_2$ and the point 54.

An oscillator frequency of 10 MHz resulted when the following exemplary components were used in circuit 50:

$T_1 = 2N2369$
$T_2 = 2N2369$
$R_{B1} = 100$ kΩ
$R_{B2} = 33$ kΩ
$R_{C1} = 5.1$ kΩ
$R_{C2} = 5.1$ kΩ
$R_3 = 100$ kΩ
$R_E = 2$ kΩ
$C_B = 0.1$ μf
$C_{C1} = 0.1$ μf
$C_{C2} = 0.1$ μf
$R_1 = 100$ Ω
$R_2 = 100$ Ω
$L_1 = 4.0$ μH
$L_2 = 4.8$ μH
$C_1 = 15.9$ pf
$C_2 = 212.0$ pf
B+ = 15 volts With the proper selection of component values, a stable oscillator can be achieved for any discrete frequency within the range of frequencies of 5 to 20 MHz.

Oscillator circuit 50 is extremely stable. One factor responsible for the stability of the circuit 50 is that the inherent noise present in the circuit causes changes in frequency in either half of the circuit to oppose each other. Another stability enhancing factor is the circuit's biasing arrangement. Additional stabilization may be had by inserting crystal 56 in the circuit to either be in parallel with the resistor $R_{B2}$, or in series with the variable resistor $R_3$.

The preferred output point of the oscillator circuit 50 is the juncture 52. This point ensures that the symmetry of the circuit is maintained because neither half is loaded more than the other half.

Obviously, numerous modifications and variations of the present invention are possible in the light of this disclosure. One such modification of the present invention is that any three terminal active device can be used in the present invention. It is therefore to be understood that within the scope of the appended claims the invention may be practiced other than as specifically described therein.

I claim:
1. An oscillator circuit comprising:
a first transistor;
a second transistor matched to said first transistor;

said first and second transistors having their base electrodes directly connected together and having their emitter electrodes directly connected together;

circuit means connected to terminals connectable to a unidirectional voltage source for identically biasing said transistors, said circuit means including a first resistance connected between said terminals and to said base electrodes at a first intermediate point, a second resistance connected between said emitter electrodes and one of said terminals, a third resistance connected between another of said terminals and the collector of said first transistor, and a fourth resistance connected between said another terminal and the collector of said second transistor;

a first series network including first means for adjusting the symmetry of said oscillator circuit, a first inductance, and a first coupling capacitor, said first series network connected between said another terminal and said collector electrode of said first transistor;

a first capacitor shunting said base and collector electrodes of said first transistor;

a second series network including second means for adjusting the symmetry of said oscillator circuit and a second capacitor, said second series network connected between said another terminal and said collector electrode of said second transistor;

a third series network including a second inductance and a second coupling capacitor, said third series network connected between said base and collector electrodes of said second transistor;

a first bypass capacitor connected between said one terminal and said first resistance at a second intermediate point; and a second bypass capacitor connected between said emitter electrodes and said one terminal.

2. The oscillator of claim 1 wherein said first means for adjusting the symmetry of said oscillator circuit comprises a first variable resistor.

3. The oscillator of claim 1 wherein said second means for adjusting the symmetry of said oscillator circuit comprises a second variable resistor.

4. The oscillator of claim 1 wherein said first inductance comprises a crystal.

5. The oscillator of claim 1 wherein said second inductance comprises a crystal.

6. The oscillator of claim 1 wherein said transistors are npn transistors.

7. The oscillator of claim 1 wherein the quiescent point of said transistors established by said circuit means is constant.

8. An oscillator circuit comprising:
a first transistor;
a second transistor matched to said first transistor;
said first and second transistors having their base electrodes directly connected together and having their emitter electrodes directly connected together;

circuit means connected to terminals connectable to a unidirectional voltage source for identically biasing said transistors, said circuit means including a first resistance connected between said terminals and to said base electrodes at an intermediate point, a second resistance connected between one of said terminals and the collector of said first transistor, a third resistance connected between said one terminal and the collector of said second transistor, and a series resistive network having a fourth resistance and fifth resistance, said series resistive network connected between another of said terminals and said emitter electrodes;

a bypass capacitor connected between said intermediate point and said another terminal;

a first series network including first means for adjusting the symmetry of said oscillator circuit, a first inductor, and a first coupling capacitor, said first series network connected between said one terminal and said collector electrode of said first transistor;

a second series network having second means for adjusting the symmetry of said oscillator circuit, and a first capacitor, said second series network connected between said one terminal and said collector electrode of said second transistor;

a third series network having a second inductor and a second coupling capacitor, said third series network connected between said collector electrode of said second transistor and the juncture of said fourth and fifth resistors; and a second capacitor connected between said collector electrode of said first transistor and said juncture.

9. The oscillator of claim 8 wherein said first means for adjusting the symmetry of said oscillator circuit comprises a first variable resistor.

10. The oscillator of claim 8 wherein said second means for adjusting the symmetry of said oscillator circuit comprises a second variable resistor.

11. The oscillator of claim 8 wherein said transistors are npn transistors.

12. The oscillator of claim 8 wherein said fourth resistance is variable to add positive admittance to said juncture to compensate for excess gain and to reduce clipping in said oscillator circuit.

13. The oscillator of claim 8 further comprising a crystal connected between said intermediate point and said another terminal.

14. The oscillator of claim 8 further comprising a crystal connected in series with said series resistive network between said juncture and said fourth resistance.

15. The oscillator of claim 8 wherein the quiescent point of said transistors established by said circuit means is constant.

16. An oscillator comprising:
a first amplifier circuit having a transconductance, an inductive load impedance, and a capacitive input susceptance;
a second amplifier circuit having a transconductance, a capacitive load impedance, and an inductive input susceptance; and
circuit means interconnecting said first and second amplifier circuits in parallel so that said inductive input susceptance of said second amplifier circuit adds negative input conductance to said first amplifier circuit for rendering it operational as a Hartley-type oscillator and said capacitive input susceptance of said first amplifier circuit adds negative input conductance to said second amplifier circuit for rendering it operational as a Colpitts-type oscillator.

17. The oscillator of claim 16 wherein said capacitive input susceptance and said inductive input susceptance oppose each other to cause the quiescent current of said oscillator to remain constant.

* * * * *